US012243711B2

(12) United States Patent
Nishihata et al.

(10) Patent No.: US 12,243,711 B2
(45) Date of Patent: Mar. 4, 2025

(54) METHOD, APPARATUS, AND PROGRAM FOR DETERMINING CONDITION RELATED TO CAPTURED IMAGE OF CHARGED PARTICLE BEAM APPARATUS

(71) Applicant: Hitachi High-Tech Corporation, Tokyo (JP)

(72) Inventors: Takahiro Nishihata, Tokyo (JP); Yuji Takagi, Tokyo (JP); Takuma Yamamoto, Tokyo (JP); Yasunori Goto, Tokyo (JP); Yasutaka Toyoda, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 418 days.

(21) Appl. No.: 17/855,888

(22) Filed: Jul. 1, 2022

(65) Prior Publication Data
US 2023/0032587 A1   Feb. 2, 2023

(30) Foreign Application Priority Data

Jul. 29, 2021  (JP) .................................. 2021-124636

(51) Int. Cl.
*H01J 37/22* (2006.01)
*G01N 23/2251* (2018.01)
*H01J 37/28* (2006.01)

(52) U.S. Cl.
CPC ........ *H01J 37/222* (2013.01); *G01N 23/2251* (2013.01); *H01J 37/28* (2013.01);
(Continued)

(58) Field of Classification Search
CPC ...................... H01J 37/222; H01J 37/28; H01J 2237/24592; H01J 2237/2817; G01N 23/2251; G01N 2223/6116
See application file for complete search history.

(56) References Cited

U.S. PATENT DOCUMENTS

2009/0037134 A1   2/2009  Kulkarni et al.
2009/0080759 A1   3/2009  Bhaskar et al.
(Continued)

FOREIGN PATENT DOCUMENTS

JP   2010535430 A   11/2010
JP   2011501875 A   1/2011
(Continued)

OTHER PUBLICATIONS

Office Action issued on Jul. 9, 2024 for Japanese Patent Application No. 2021-124636.

*Primary Examiner* — Nicole M Ippolito
*Assistant Examiner* — Hanway Chang
(74) *Attorney, Agent, or Firm* — Volpe Koenig

(57) ABSTRACT

A method, an apparatus, and a program for more appropriately determining a condition for appropriately recognizing a semiconductor pattern are provided. A method for determining a condition related to a captured image of a charged particle beam apparatus including: acquiring, by a processor, a plurality of captured images, each of the captured images being an image generated by irradiating a pattern formed on a wafer with a charged particle beam, and detecting electrons emitted from the pattern, each of the captured images being an image captured according to one or more imaging conditions, the method further including: acquiring teaching information for each of the captured images; acquiring, by the processor, one or more feature determination conditions; calculating, by the processor, a feature for each of the captured images based on each of the feature determination conditions, at least one of the imaging condition and the feature determination condition being plural.

28 Claims, 14 Drawing Sheets

(52) U.S. Cl.
CPC ............. *G01N 2223/6116* (2013.01); *H01J 2237/24592* (2013.01); *H01J 2237/2817* (2013.01)

(56) References Cited

U.S. PATENT DOCUMENTS

| | | |
|---|---|---|
| 2011/0001816 A1 | 1/2011 | Yonekura et al. |
| 2012/0276664 A1 | 11/2012 | Markwort et al. |
| 2016/0117847 A1 | 4/2016 | Pandev et al. |
| 2019/0017817 A1 | 1/2019 | Fukunaga |
| 2019/0049602 A1 | 2/2019 | Hench et al. |
| 2020/0134824 A1 | 4/2020 | Adiga |

FOREIGN PATENT DOCUMENTS

| | | |
|---|---|---|
| JP | 2020095691 A | 6/2020 |
| JP | 2020126254 A | 8/2020 |
| JP | 2020530942 A | 10/2020 |
| WO | 2009/116634 A1 | 9/2009 |
| WO | 2017130365 A1 | 8/2017 |

FIG. 5A
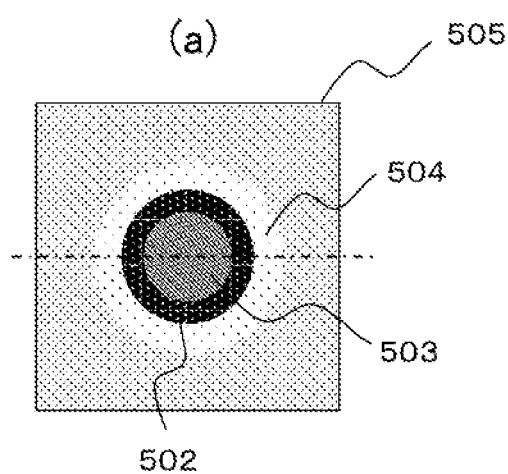
FIG. 5B
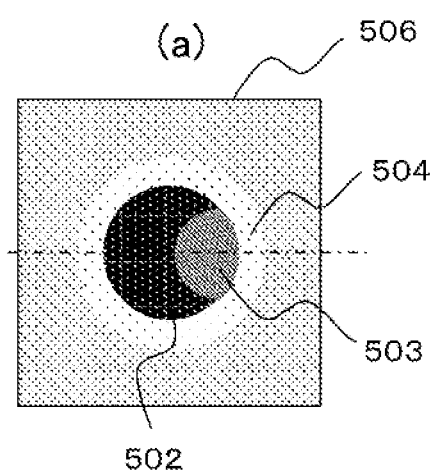
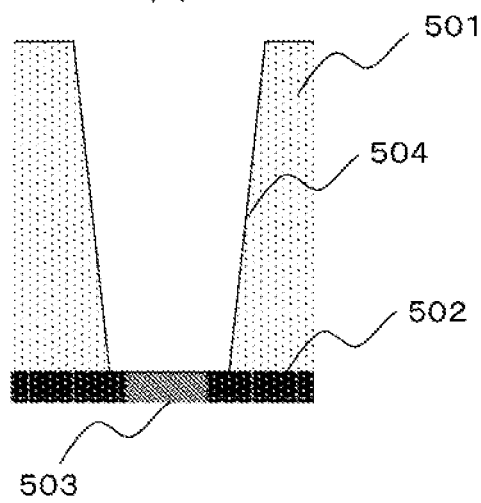
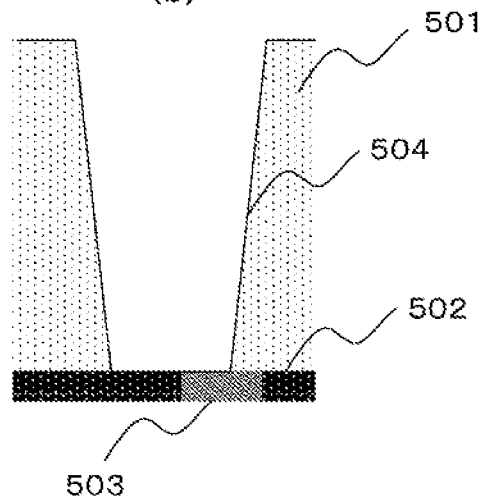

FIG. 6A
(a)
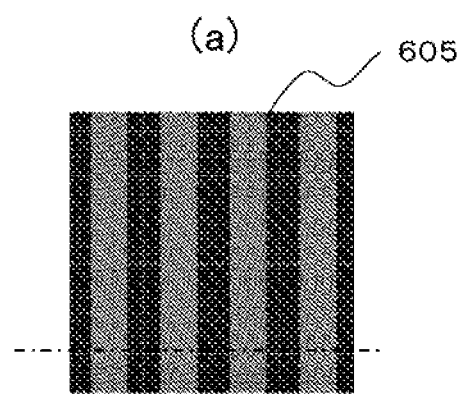
605
(b)
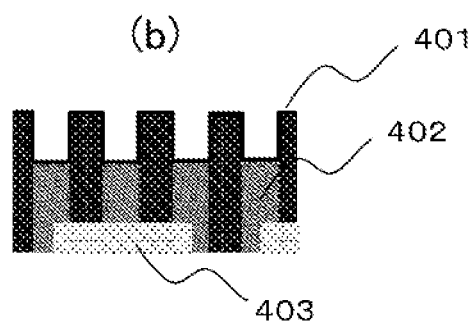
401
402
403
FIG. 6B
(a)
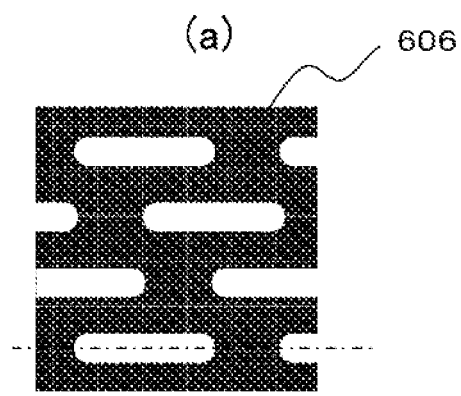
606
(b)
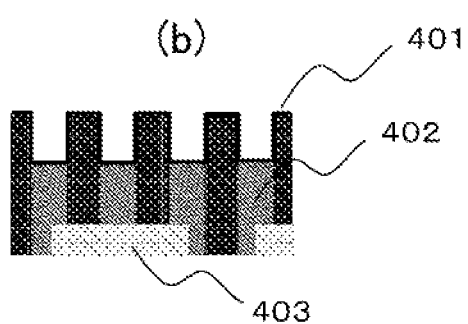
401
402
403

FIG. 7A
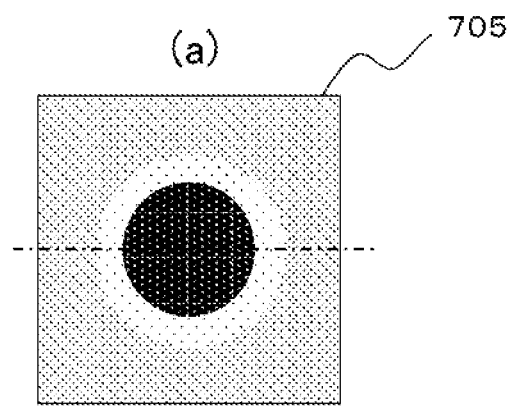
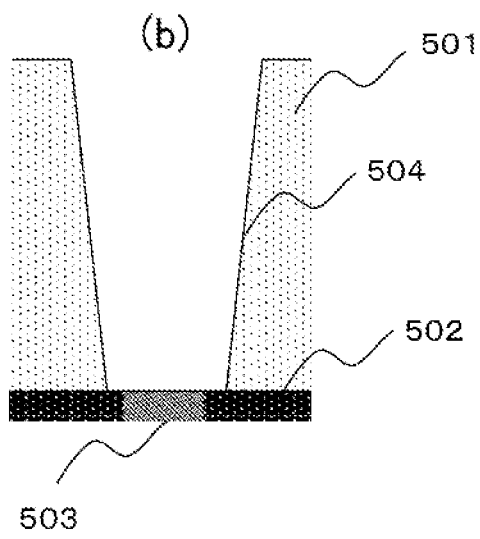
FIG. 7B
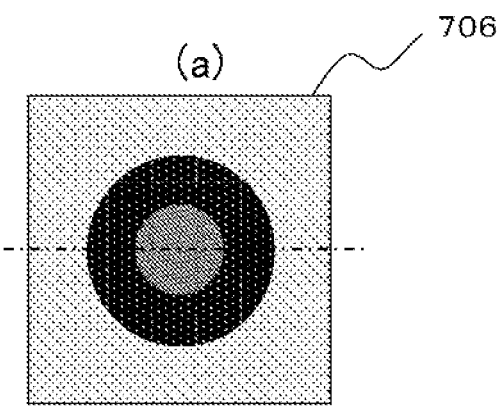
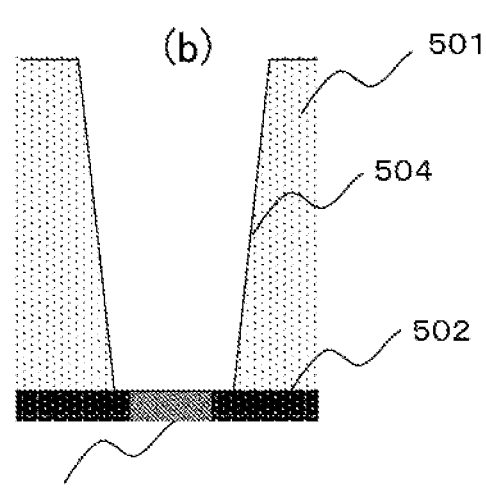

FIG. 10

| | CAPTURED IMAGE 1 | CAPTURED IMAGE 2 | CAPTURED IMAGE 3 | ... |
|---|---|---|---|---|
| TEACHING INFORMATION OVERLAY ERROR | ± 0 nm | + 5 nm | + 10 nm | ... |
| CENTER DEVIATION AMOUNT BETWEEN PARTIAL REGIONS 1 AND 2 UNDER IMAGING CONDITION 1 (ACCORDING TO FEATURE DETERMINATION CONDITION 1) | ± 0 nm | + 5 nm | + 10 nm | ... |
| CENTER DEVIATION AMOUNT BETWEEN PARTIAL REGIONS 1 AND 3 UNDER IMAGING CONDITION 1 (ACCORDING TO FEATURE DETERMINATION CONDITION 2) | ± 0 nm | ± 0 nm | − 5 nm | ... |
| CENTER DEVIATION AMOUNT BETWEEN PARTIAL REGIONS 2 AND 3 UNDER IMAGING CONDITION 1 (ACCORDING TO FEATURE DETERMINATION CONDITION 3) | ± 0 nm | + 5 nm | ± 0 nm | ... |
| ... | ... | ... | ... | ... |

↓ CALCULATE REGRESSION CURVE

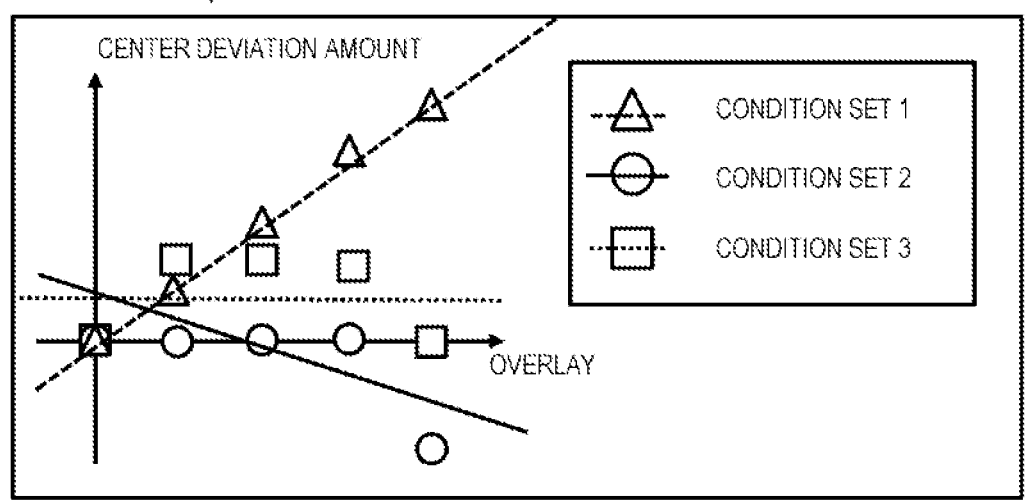

FIG. 13A
(a)
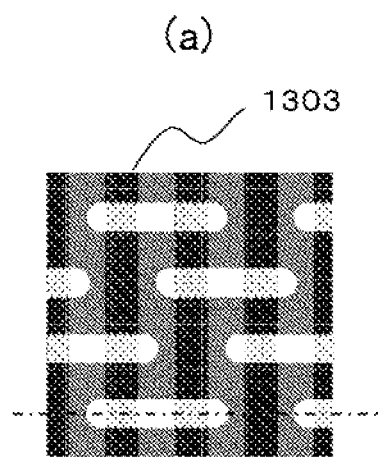
1303
(b)
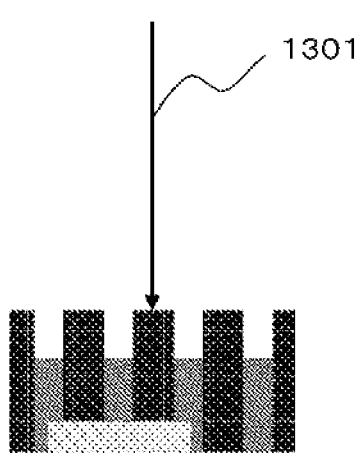
1301
FIG. 13B
(a)
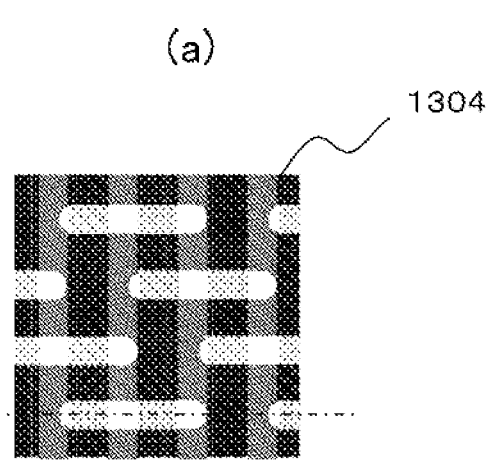
1304
(b)
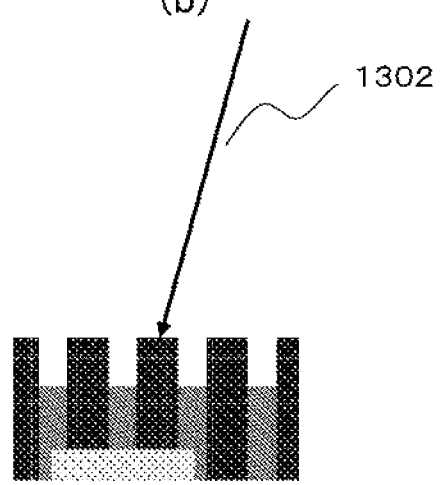
1302

FIG. 14A
(a)
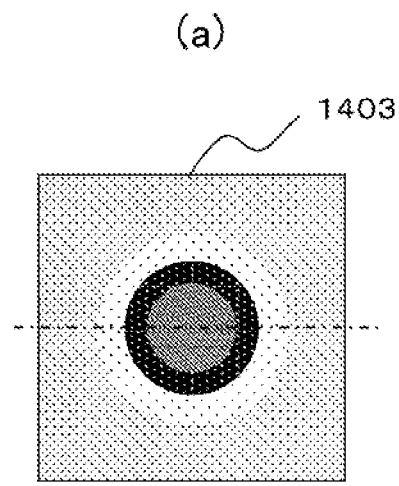
(b)
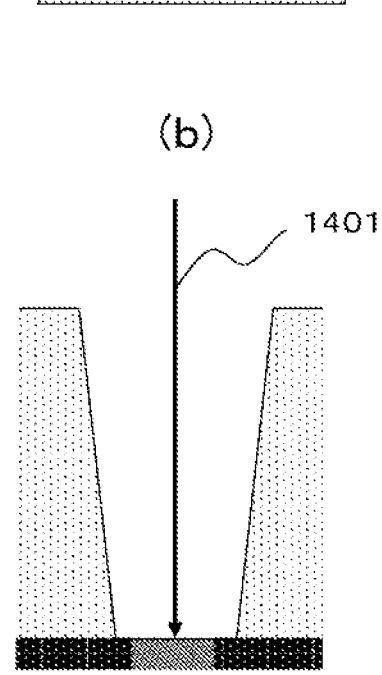
FIG. 14B
(a)
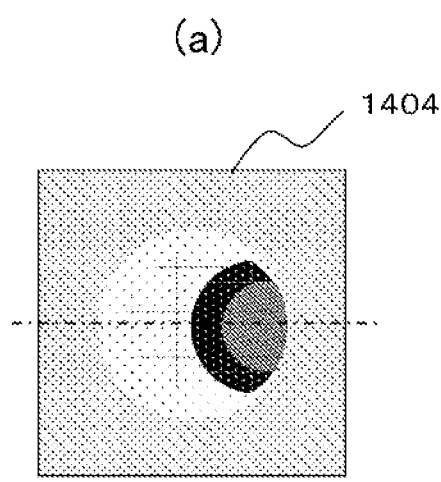
(b)
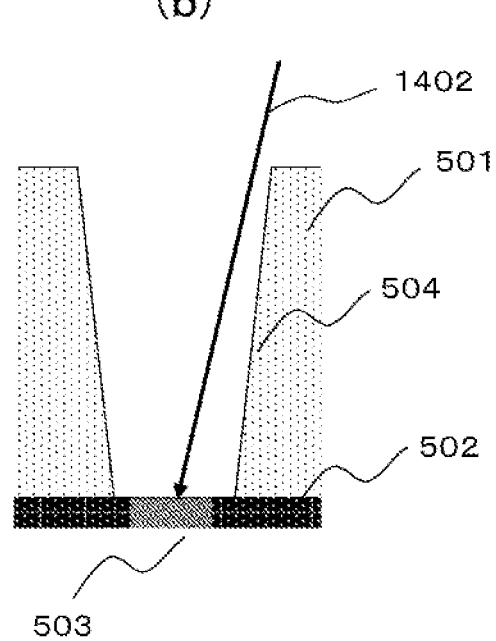

METHOD, APPARATUS, AND PROGRAM FOR DETERMINING CONDITION RELATED TO CAPTURED IMAGE OF CHARGED PARTICLE BEAM APPARATUS

BACKGROUND OF THE INVENTION

1. Field of the Invention

The present invention relates to a method, an apparatus, and a program for determining a condition related to a captured image of a charged particle beam apparatus.

2. Description of the Related Art

In a pattern manufactured by a semiconductor process in recent years, miniaturization and multi-layered structuring have progressed, and improvement in accuracy of dimension measurement (for example, overlay error measurement) of the pattern across a plurality of layers of an exposure apparatus is required. For example, a pattern positioned at a plurality of heights can be measured by detecting reflected electrons or the like obtained when a sample is irradiated with a high-acceleration electron beam of 15 kV or higher.

Variations of overlapping between a plurality of patterns also increase. When a degree of the overlapping is different, an appearance on an image is different. With respect to such a problem, WO2017/130365 (Patent Literature 1) discloses a method for extracting only a desired pattern on an SEM image by creating a template serving as a starting point of a boundary search of a region in advance and using the template for pattern identification.

However, a technique in the related art has a problem in that it is difficult to determine a condition for appropriately recognizing a semiconductor pattern. Such a condition includes, for example, an imaging condition and a condition for determining a feature of the pattern based on an image.

In order to determine the imaging condition, it is necessary to understand a structure of an imaging target and characteristics of an optical system and a detection system of a charged particle beam apparatus. For example, when an appropriate acceleration condition of a high-acceleration electron beam is not set in accordance with a target structure, a pattern on a layer to be focused cannot be emphasized, or conversely, a pattern on a layer other than the layer to be focused is emphasized.

The condition for determining the feature of the pattern based on the image includes an image processing condition or a combination thereof. In order to adjust the image processing condition, it is necessary to understand an advanced image processing algorithm. For example, it is difficult to determine an appropriate image processing condition for emphasizing a pattern of a specific layer and preventing emphasis of an unnecessary layer in a captured image in which a multilayer pattern is reflected.

For this reason, for example, a degree of difficulty in determining conditions for determining the imaging condition and the feature increases, adjustment time becomes long, and this becomes a problem when a new measurement process is started up.

The invention has been made to solve such a problem, and an object of the invention is to provide a technique for more appropriately determining a condition for appropriately recognizing a semiconductor pattern.

SUMMARY OF THE INVENTION

An aspect of a method according to the invention is a method for determining a condition related to a captured image of a charged particle beam apparatus, the method includes:

acquiring, by a processor, a plurality of captured images, each of the captured images being an image generated by irradiating a pattern formed on a wafer with a charged particle beam, and detecting electrons emitted from the pattern, each of the captured images being an image captured according to one or more imaging conditions.

The method further includes:

acquiring, by the processor, teaching information for each of the captured images;

acquiring, by the processor, one or more feature determination conditions; and calculating, by the processor, a feature for each of the captured images based on each of the feature determination conditions, at least one of the imaging condition and the feature determination condition being plural.

The method still further includes:

acquiring, by the processor, a regression curve of the feature and the teaching information based on the plurality of captured images under each of condition sets each including a combination of the imaging condition and the feature determination condition; and selecting, by the processor, one or more of the condition sets based on the regression curve.

An aspect of an apparatus according to the invention executes the above-described method.

An aspect of a program according to the invention causes a computer to execute the above-described method.

According to the method, the apparatus, and the program of the invention, it is possible to more appropriately determine a condition for appropriately recognizing a semiconductor pattern.

BRIEF DESCRIPTION OF THE DRAWINGS

FIGS. 4A and 4B are views each showing a part of a semiconductor device having a multilayer structure and an example of an SEM image thereof. In this example, both a lower layer pattern and an upper layer pattern are seen through.

FIGS. 5A and 5B are views each showing a part of a semiconductor device having a multilayer structure and an example of an SEM image thereof. In this example, a part of a lower layer pattern is hidden by an upper layer pattern.

FIGS. 6A and 6B are views each showing an example of an SEM image obtained by imaging a pattern of FIG. 4A under an inappropriate imaging condition.

FIGS. 7A and 7B are views each showing an example of an SEM image obtained by imaging a pattern of FIG. 5A under an inappropriate imaging condition.

FIG. 10 is a diagram showing an example of a regression curve of a feature of a partial region obtained under one or more feature determination conditions and teaching information.

FIGS. 13A and 13B are views each showing an example of an SEM image in which an overlay error is generated in a pseudo manner by imaging the pattern of FIG. 4A or 4B by inclining an electron beam in a second embodiment.

FIGS. 14A and 14B are views each showing an example of an SEM image in which an overlay error is generated in a pseudo manner by imaging the pattern of FIG. 5A or 5B by inclining the electron beam in the second embodiment.

DESCRIPTION OF THE PREFERRED EMBODIMENTS

Embodiments of the invention will be described below with reference to accompanying drawings.

First Embodiment

In a first embodiment, an experimental wafer having a known overlay is utilized.

Example of Semiconductor Pattern as Target of Present Embodiment

Hereinafter, a semiconductor pattern may be simply referred to as a pattern. The pattern is represented by, for example, a two-dimensional shape. When an acceleration voltage of an electron beam of an SEM for imaging a semiconductor wafer is increased, the electron beam is transmitted, and images such as SEM images 404, 407 of FIGS. 4A and 4B and SEM images 505, 506 of FIGS. 5A and 5B are obtained for a lower layer pattern.

Figure 4A:
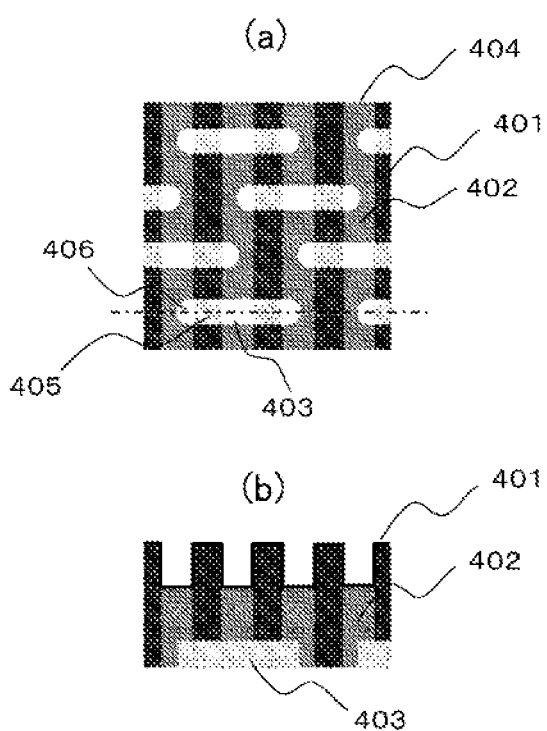

In FIG. 4A, (a) of FIG. 4A on an upper side of a paper shows an SEM image (corresponding to, for example, a top view), and (b) of FIG. 4A on a lower side of the paper shows a vertical cross-sectional view taken along a dashed line in (a) of FIG. 4A. The same applies to FIGS. 4B, 5A, 5B, 6A, 6B, 7A, 7B, 13A, 13B, 14A, and 14B.

A semiconductor sample shown in FIG. 4A as an example includes the following patterns.

Plurality of upper layer patterns 401 that form plurality of trenches (groove-shaped patterns) therebetween Pattern 402 constituting bottom portion of trench Lower layer pattern 403 located on lower layer of pattern 401 and formed so as to extend in direction orthogonal to longitudinal direction of pattern 401

The patterns 401 to 403 are displayed in the SEM image 404. A low-acceleration electron beam cannot reach the pattern 403 which is not exposed on a sample surface, and the pattern 403 is not displayed, but when a high-acceleration electron beam is emitted, the electron beam penetrates through the patterns 401, 402 and reaches the pattern 403, and thus the pattern 403 is displayed.

Meanwhile, the pattern 401 is located on an upper layer of a portion 405 which is a part of the pattern 403, and the pattern 402 is located on an upper layer of a portion 406 which is a part of the pattern 403. The number of emitted electrons, that is, brightness of an image, varies depending on presence or absence, a thickness, a material, and the like of a layer through which the electron beam passes. Therefore, one pattern (pattern 403) is drawn with a plurality of image contrasting densities.

Figure 4B:
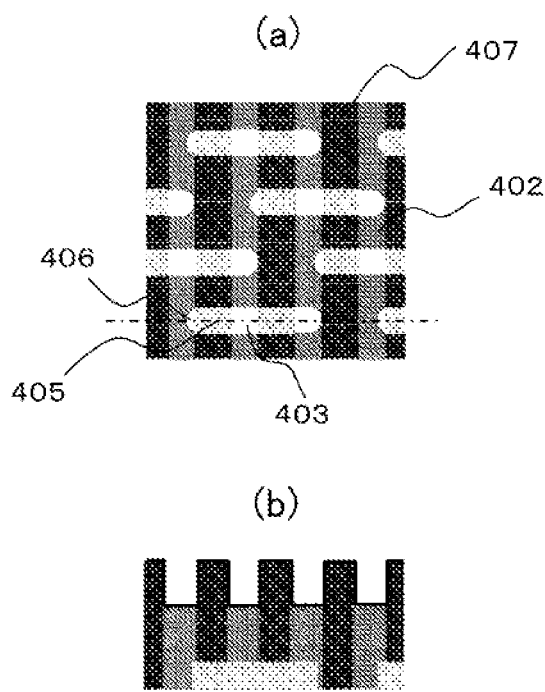

FIG. 4B shows the SEM image 407 and a cross-sectional view thereof when an overlay error occurs among the upper layer pattern 401, the pattern 402 located at the bottom portion of the trench, and the lower layer pattern 403. Brightness of each portion of the SEM image 407 is the same as that of the SEM image 404, but in the SEM image 407, the portion 406 is reflected in a state of being shifted due to the overlay error.

In the examples shown in FIGS. 4A and 4B, it is desirable that both ends of the pattern 403 extend equally to the patterns 402 located at the bottom portions of the trenches as shown in the portion 406, and thus, it is preferable that it is possible to confirm whether a relationship between the patterns is in such a manner. Therefore, in order to measure the overlay error in the SEM image shown in FIG. 4B, it is preferable to extract respective regions of the upper layer pattern 401, the pattern 402 located at the bottom portion of the trench, and the lower layer pattern 403.

A semiconductor sample shown in FIG. 5A as an example includes the following patterns.

Pattern 501 forming upper layer of deep (for example, micron order or higher) hole pattern Pattern 502 constituting lower layer of hole pattern Pattern 503 appearing at hole bottom In the SEM image 505, the patterns 501 to 503 and a pattern 504 on a side wall portion of the hole pattern are displayed. For a low-acceleration electron beam, electrons emitted from the pattern 503 appearing at the hole bottom cannot escape from an upper surface (for example, are absorbed by a side wall), resulting in the pattern 503 not being displayed. On the other hand, when a high-acceleration electron beam is emitted, electrons emitted from the pattern 503 penetrate through the pattern 501 and can escape from the upper surface, and thus, the pattern 503 is displayed.

FIG. 5B shows an example of the SEM image 505 and a cross-sectional view when an overlay error occurs between the upper layer pattern 501 and the lower layer pattern 503. Unlike FIGS. 4A and 4B, since a hole is deep, even being irradiated with a high-acceleration beam, electrons emitted from a portion, where the upper layer pattern 501 overlaps, of the pattern 503 appearing at a hole bottom cannot penetrate through the upper layer pattern 501 in a reciprocating manner. Therefore, a shape of the pattern 503 does not completely appear on the SEM image, and is overwritten with brightness of the pattern 501 and brightness of the pattern 504 of the side wall portion.

In the examples shown in FIGS. 5A and 5B, since it is desirable that the lower layer pattern 503 is located at a center of the hole bottom, it is preferable that it is possible to confirm whether a relationship between the patterns is in such a manner. Therefore, in order to measure the overlay error in the image shown in FIG. 5B, it is preferable to extract respective regions of the pattern 502 and the pattern 503 appearing at the hole bottom.

The examples of the SEM image shown in FIGS. 4A, 4B, 5A, and 5B are each a case in which the upper layer pattern and the lower layer pattern shown in the cross-sectional view can be confirmed on the SEM image. However, in order to emphasize the patterns on the image in this manner, it is necessary to appropriately determine an imaging condition such as an acceleration voltage and an energy discrimination condition of a detector.

The imaging condition includes, for example, information related to at least one of the following.

Irradiation Energy of Charged Particle Beam

Threshold value of energy used when emitted electrons are detected

When such an imaging condition is used, there is a high possibility that a good image can be acquired by appropriately adjusting the imaging condition.

In the semiconductor patterns of FIGS. 4A, 4B, 5A, and 5B, examples of the SEM image when the imaging condition is inappropriate are shown in FIGS. 6A, 6B, 7A, and 7B, respectively. FIG. 6A shows an SEM image 605 in which the lower layer pattern 403 cannot be emphasized since an acceleration voltage is too low. FIG. 6B shows an SEM image 606 in which a contrast of brightness between the upper layer pattern 401 and the pattern 402 located at a bottom portion of a trench disappears since conversely, an acceleration voltage is too high. Similarly, FIG. 7A shows an SEM image 705 in which the pattern 503 appearing at the hole bottom cannot be emphasized since an acceleration voltage is too low, and FIG. 7B shows an SEM image 706 in which a contrast of brightness between a hole bottom and a side wall disappears since, conversely, an acceleration voltage is too high.

When a measurement process of a pattern dimension or an overlay error is started up, an operator may manually adjust the imaging condition, so that the inappropriate SEM images shown in FIGS. 6A, 6B, 7A, and 73 are not obtained. However, in this case, as described above, it is necessary to understand a structure of an imaging target and characteristics of an optical system and a detection system of a charged particle beam apparatus. In addition, assuming that the SEM images shown in FIGS. 4A, 4B, 5A, and 5B are obtained, the operator may manually adjust a feature determination condition for determining a desired pattern dimension or an overlay error as a region feature. However, as described above, it is also necessary to understand an image processing algorithm for measuring the pattern dimension and the overlay error. For this reason, it is a problem that adjustment of the imaging condition and the feature determination condition places a heavy load on the operator and takes time for the adjustment.

Charged Particle Beam Apparatus According to First Embodiment

Figure 11:
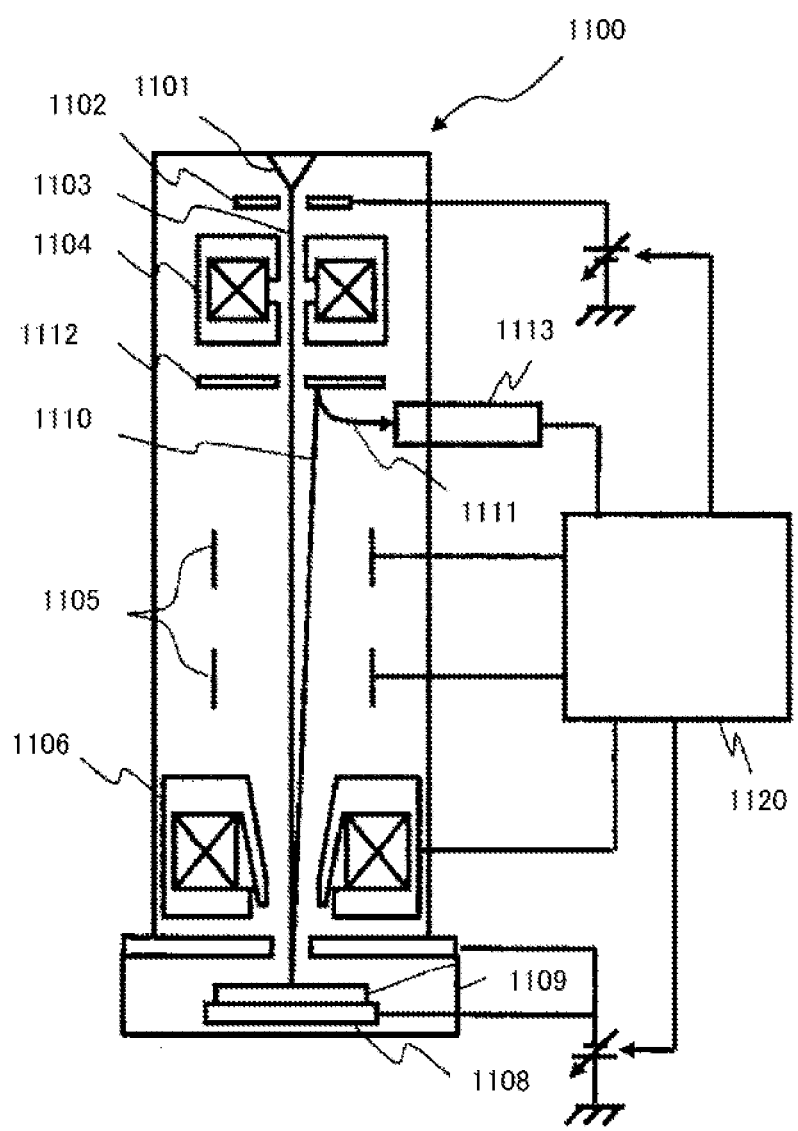
FIG. 11 is a diagram showing an example of a scanning electron microscope.

FIG. 11 is a diagram showing an outline of a scanning electron microscope (SEM) 1100 which is a type of charged particle beam apparatus that can be used in the first embodiment. An electron beam 1103 extracted from an electron source 1101 by an extraction electrode 1102 and accelerated by an acceleration electrode (not shown) is focused by a condenser lens 1104, which is a form of a focusing lens, and then one-dimensionally or two-dimensionally scans a sample 1109 by a scanning deflector 1105. The electron beam 1103 is decelerated by a negative voltage applied to an electrode built-in a sample stage 1108, and is focused by a lens action of an objective lens 1106, so as to be emitted onto the sample 1109.

When the sample 1109 is irradiated with the electron beam 1103, electrons 1110 such as secondary electrons and backscattered electrons are emitted from an irradiated portion. The emitted electrons 1110 are accelerated in a direction toward the electron source by an acceleration action based on a negative voltage applied to the sample, and collide with a conversion electrode 1112, so that secondary electrons 1111 are generated. The secondary electrons 1111 emitted from the conversion electrode 1112 are captured by a detector 1113, and an output of the detector 1113 changes depending on an amount of the captured secondary electrons. Brightness of a display device (not shown) changes due to the output. For example, in a case of forming a two-dimensional image, an image of a scanning region is formed by synchronizing a deflection signal to the scanning deflector 1105 with the output of the detector 1113.

The scanning electron microscope shown in FIG. 11 as an example is a device capable of applying a high voltage (for example, 15 kV or higher) to the acceleration electrode (not shown), and can cause the electron beam to reach an embedded pattern or the like that is not exposed on a sample surface by emitting the electron beam at high acceleration.

In the example of FIG. 11, the example in which the electrons emitted from the sample are once converted by the conversion electrode to be detected is described, but the present invention is not limited to such a configuration, and for example, a configuration in which an electron multiplier tube or a detection plane of a detector is disposed on a trajectory of accelerated electrons can also be adopted. In addition, the number of each of the conversion electrode 1112 and the detector 1113 is not necessarily one, and a plurality of detection planes divided in an azimuth angle direction or an elevation angle direction with respect to an optical axis and detectors corresponding to the respective detection planes may be provided. With this configuration, it is possible to simultaneously acquire a number of captured images from the detectors by one time imaging.

A control device 1120 has, for example, the following functions.

Function of controlling components of scanning electron microscope

Function of forming image based on detected electrons

Function of measuring pattern width of pattern formed on sample (for example, measuring based on intensity distribution of detected electrons referred to as line profile)

The control device 1120 includes an SEM control device that mainly controls optical conditions of the SEM and a signal processing device that executes signal processing on a detection signal obtained by the detector 1113. The control device 1120 includes a scanning control device for controlling beam scanning conditions (direction, speed, and the like). In addition, a storage medium (not shown) is provided in the control device 1120, and a program for causing a computer (including a processor) to execute image processing and calculation as described later may be stored. The computer may be a calculator.

Processing Flow of First Embodiment

Figure 1:
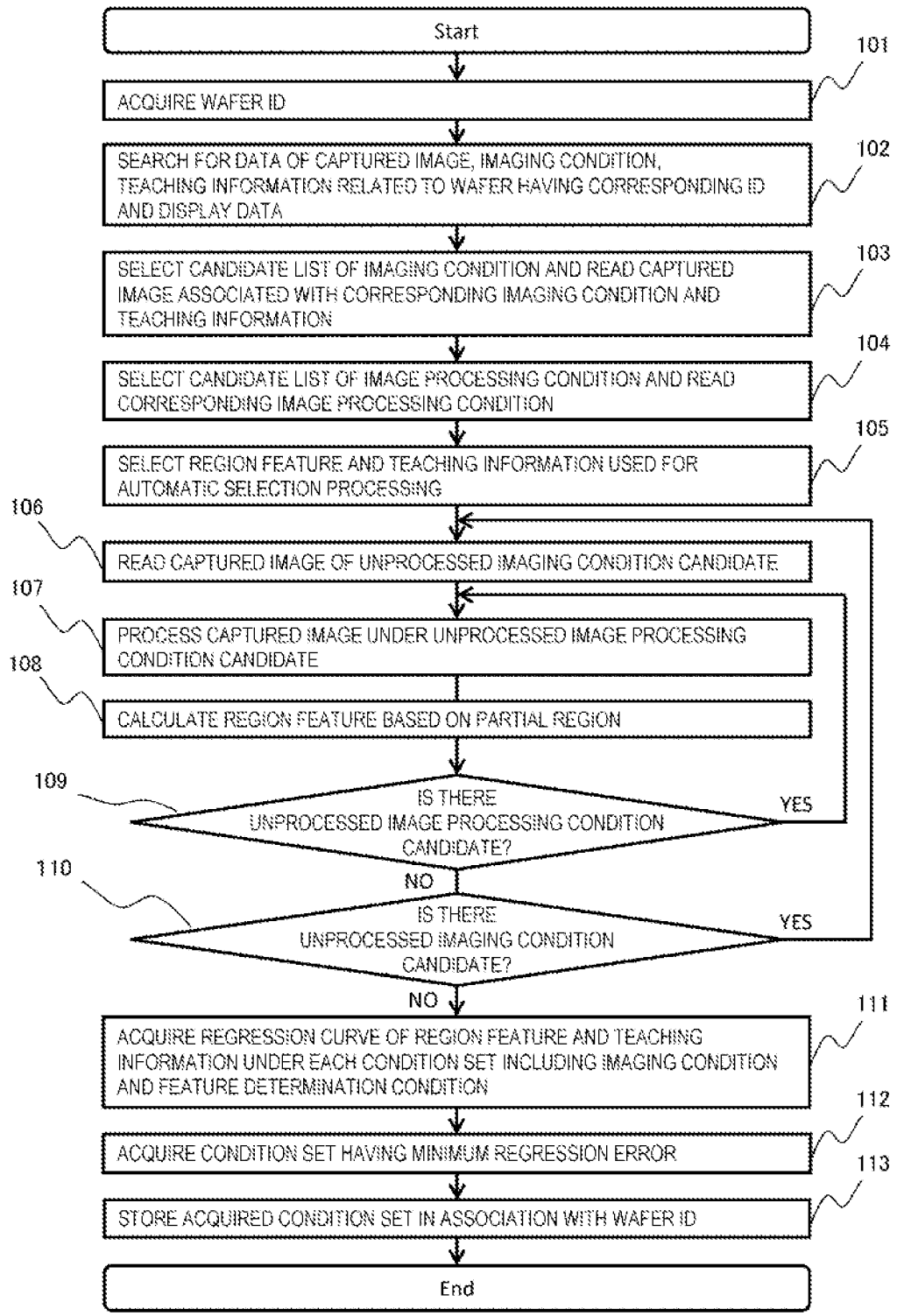
FIG. 1 is a flowchart showing a process of selecting an imaging condition and an image processing condition.

FIG. 1 is a flowchart showing a process of selecting the imaging condition and the feature determination condition according to the first embodiment. This flowchart shows a method for determining conditions related to a captured image of the charged particle beam apparatus. The control device 1120 functions as a device that determines conditions related to a captured image of the charged particle beam apparatus by executing the method shown in FIG. 1.

The method shown in FIG. 1 can be executed by, for example, a computer having a known hardware configuration. The computer includes, for example, a calculation unit and a storage unit. The calculation unit includes, for example, a processor, and the storage unit includes, for example, a storage medium such as a semiconductor memory device and a magnetic disk device. A part or all of the storage medium may be a non-transitory storage medium.

In addition, the computer may include an input/output unit. The input/output unit includes, for example, an input device such as a keyboard and a mouse, an output device such as a display and a printer, and a communication device such as a network interface.

The storage unit may store the program. The processor may execute the program to cause the computer to execute the functions described in the present embodiment.

Figure 2:
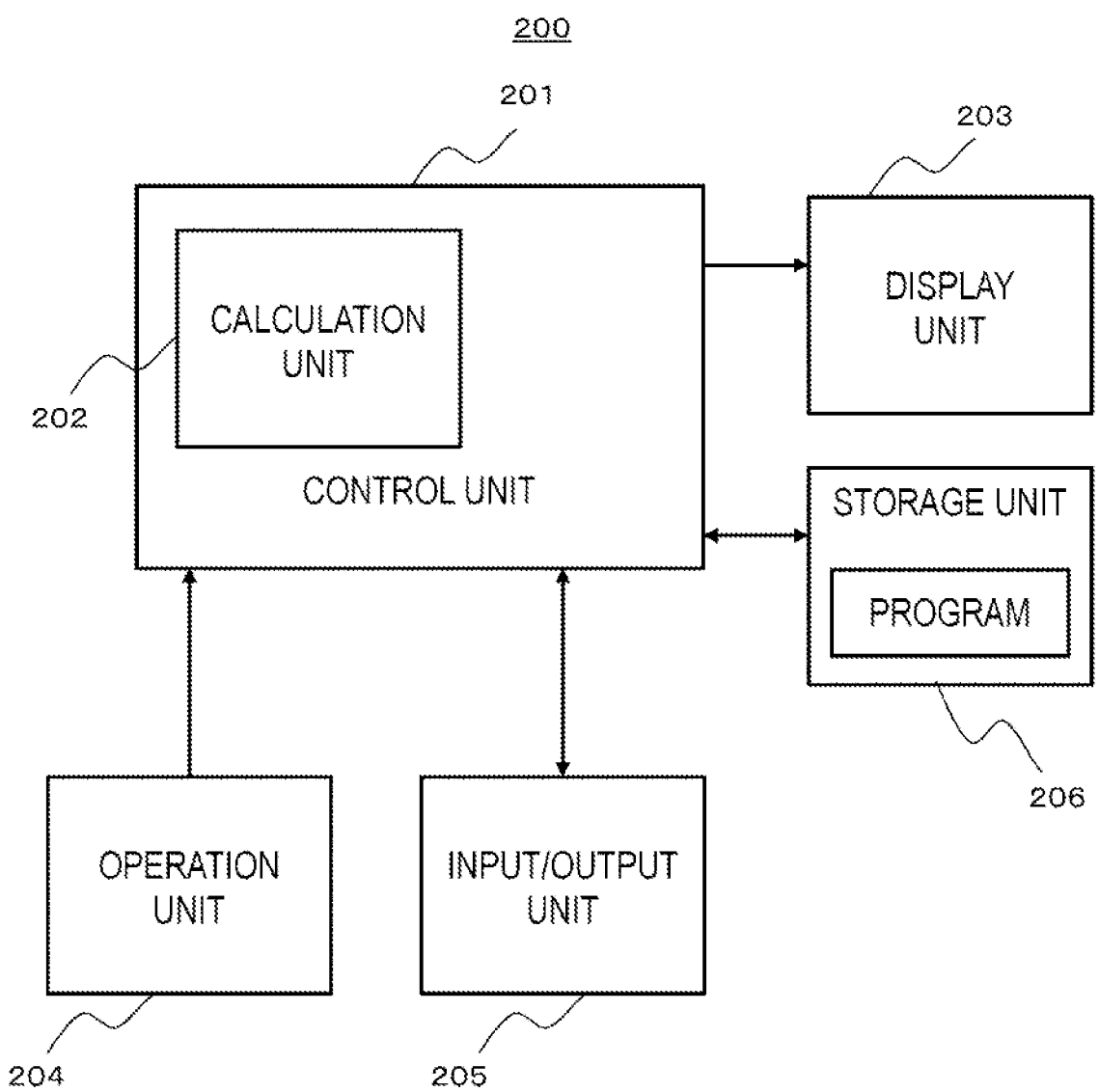
FIG. 2 is a block diagram showing an outline of a device for measuring a pattern dimension and an overlay error, which has a function of selecting the imaging condition and the image processing condition.

FIG. 2 shows a specific example including such a computer. FIG. 2 is a diagram showing an example of a device 200 having a function of automatically selecting the imaging condition and the feature determination condition. The device 200 is, for example, a device that measures a pattern dimension and an overlay error.

The device 200 has a configuration as a computer, and functions as a condition determination device for a captured image of the charged particle beam apparatus by executing a method (for example, the method shown in FIG. 1) for determining conditions related to a captured image of the charged particle beam apparatus.

The device 200 includes the following components.

Input/output unit 205 that receives image information from image generation device such as scanning electron microscope shown in FIG. 11 and outputs measurement result and the like Operation unit 204 that receives input of information required on GUI image Storage unit 206 that stores following information
Captured image used for automatic selection
Imaging condition
Teaching information (for example, information that can be directly or indirectly measured based on pattern)
Feature determination condition
Program related to operation of device 200

Control unit 201 that includes calculation unit 202. The calculation unit 202 executes calculation processing required for automatic selection of imaging condition and feature determination condition and measurement based on image information received from input/output unit 205, respective condition information received from operation unit 204 and storage unit 206, and the like Display unit 203 that displays following information
Image obtained by scanning electron microscope
Measurement result obtained based on image
GUI image In the process of FIG. 1, first, the operation unit 204 acquires an ID of a wafer to be used for the automatic selection (step 101). The wafer ID is identification information for identifying the wafer.

Based on the input wafer ID, the storage unit 206 searches for data of information (captured image, imaging condition, teaching information) related to the wafer, and displays the data on the display unit 203 (step 102). As described above, a plurality of captured images are respectively acquired in association with wafer IDs. Here, all the captured images in association with the wafer IDs may be acquired, but the acquired captured images may be further limited based on other information (such as an imaging position to be described later), and in this case, the captured images may be acquired at a later time point. In this manner, only an appropriate captured image is acquired, which is efficient.

The data such as the captured image, the imaging condition, the teaching information, and the like in association with the wafer ID can be acquired in advance prior to automatic selection processing and stored in the storage unit 206. As an example of a data set, a data file or the like in which the teaching information is associated with each captured image is considered for a setting data file (hereinafter, referred to as an "imaging recipe") of an automatic imaging function provided in a general SEM apparatus for semiconductor inspection. In an imaging recipe, the imaging condition set by a user, a wafer ID) of an imaging target, and an imaging position in the wafer are generally recorded.

A specific example of a data structure is as follows.

Each wafer ID is associated with a plurality of imaging positions.

Each imaging position is associated with one or more captured images captured at the corresponding position. That is, the captured image includes images captured at a plurality of positions. In this manner, effective learning can be performed based on the captured images captured at various positions.

Each captured image is associated with one or more imaging conditions. That is, each captured image is an image captured according to one or more imaging conditions.

Each captured image is associated with one or more pieces of teaching information.

The teaching information includes, for example, an overlay error of a pattern. By using such teaching information, it is possible to use an evaluation standard useful in semiconductor manufacturing.

Each captured image is an image generated by irradiating a pattern formed on a wafer with a charged particle beam, and detecting electrons emitted from the pattern.

Such an image can be, for example, an image captured by the scanning electron microscope 1100.

Next, the operation unit 204 selects a candidate list of the imaging condition (including one or more imaging conditions selected as candidates) according to an operation of a user, and the calculation unit 202 reads and acquires the captured image associated with the selected imaging condition and the teaching information of the captured image from the storage unit 206 (step 103). As described above, since each of the plurality of captured images are acquired in association with the respective imaging conditions, the user does not need to individually designate the captured image, which is efficient.

In order to increase a selectable imaging condition, for example, automatic imaging may be performed using an imaging recipe in which only the imaging condition is changed.

Next, the operation unit 204 selects a candidate list of the image processing condition (including one or more image processing conditions selected as candidates) according to an operation of the user, and the calculation unit 202 reads the image processing condition candidates from the storage unit 206 (step 104).

Here, the image processing condition is, for example, a condition for extracting a partial region from an image, and when an image processing algorithm is, for example, threshold value processing based on simple brightness of an image, the image processing condition includes information related to brightness (for example, a threshold value of brightness). A large number of methods are known for image processing based on brightness, and various algorithms can be used.

Alternatively, in a case of using the Graphcut method in which a template is used as a starting point as described in Patent Literature 1, the image processing condition may include a weight parameter used in the Graphcut method.

Alternatively, when a method based on deep learning or the like is used, the image processing condition may include a hyperparameter of a network.

A selectable image processing condition may be freely set and added by the user, or may be equally or randomly changed and added within certain ranges of the respective image processing conditions.

Next, the operation unit 204 selects the feature and the teaching information used for the automatic selection processing according to an operation of the user, and the calculation unit 202 reads and acquires the feature and the teaching information (step 105).

Here, the feature is, for example, a region feature determined based on a partial region extracted from the captured image. As an example, in a case in which a measurement target is a pattern dimension, the region feature includes at least one of the following as an example.

Area of partial region
Circumferential length of partial region
Maximum diameter of partial region
Minimum diameter of partial region By using such a region feature, it is possible to appropriately evaluate a specific dimension of the partial region.

In this case, one feature is determined based on one image by one image processing condition. That is, one feature determination condition includes one image processing condition.

Depending on the measurement target, a combination of a plurality of image processing conditions is used as the feature determination condition. A case in which the measurement target is an overlay error is as an example. For example, the feature determination condition includes a first image processing condition and a second image processing condition. The calculation unit 202 extracts a first partial region based on the first image processing condition for each captured image, and similarly extracts a second partial region based on the second image processing condition for each captured image. In this case, the region feature includes at least one of the following as an example.

Deviation amount between center position of first partial region and center position of second partial region
Area of portion in which first partial region and second partial region overlap
Circumferential length of portion in which first partial region and second partial region overlap
Maximum diameter of portion in which first partial region and second partial region overlap
Minimum diameter of portion in which first partial region and second partial region overlap By using such a region feature, it is possible to appropriately evaluate a dimension of a specific overlapping portion of partial regions.

A method for determining the number of image processing conditions included in one feature determination condition can be designed as appropriate, but the number of image processing conditions can be determined in advance in association with, for example, each piece of the teaching information, and the calculation unit 202 can determine the number of image processing conditions based on the selected teaching information. For example, when the teaching information is a maximum diameter, one feature determination condition includes only one image processing condition, and when the teaching information is an overlay error, one feature determination condition includes a combination of two image processing conditions.

The calculation unit 202 processes each captured image for each imaging condition candidate under each image processing condition candidate based on the captured image, the imaging condition, the teaching information, and the feature determination condition read in steps 101 to 105, obtains each partial region image, and calculates the region feature based on each partial region image (steps 106 to 110).

For example, in step 106, the calculation unit 202 acquires a captured image captured according to one imaging condition.

Next, in step 107, the calculation unit 202 acquires one image processing condition included in the candidate list for each captured image. As described above, since the image processing condition is a condition for determining the region feature, the image processing condition can also be referred to as the feature determination condition.

Next, the calculation unit 202 processes the image based on the image processing condition to extract the partial region.

Next, in step 108, the calculation unit 202 calculates the region feature based on one or more partial regions. When a plurality of partial regions are required to calculate the region feature, steps 106 and 107 may each be executed a plurality of times for one time execution of step 108.

As described above, the calculation unit 202 calculates the region feature for each captured image based on the feature determination condition (including a single image processing condition or a combination of a plurality of image processing conditions).

According to such processing, even there is a case in which a single region feature is calculated based on one partial region or a case in which a single region feature is calculated based on a plurality of partial regions (overlay error measurement or the like), both cases can be handled in the present embodiment.

Next, in step 109, when there is an unprocessed image processing condition, the processing returns to step 107, and the calculation unit 202 executes processing for all the image processing conditions.

Next, in step 110, when there is an unprocessed imaging condition, the processing returns to step 106, and the calculation unit 202 executes processing for all the imaging conditions.

Figure 8:
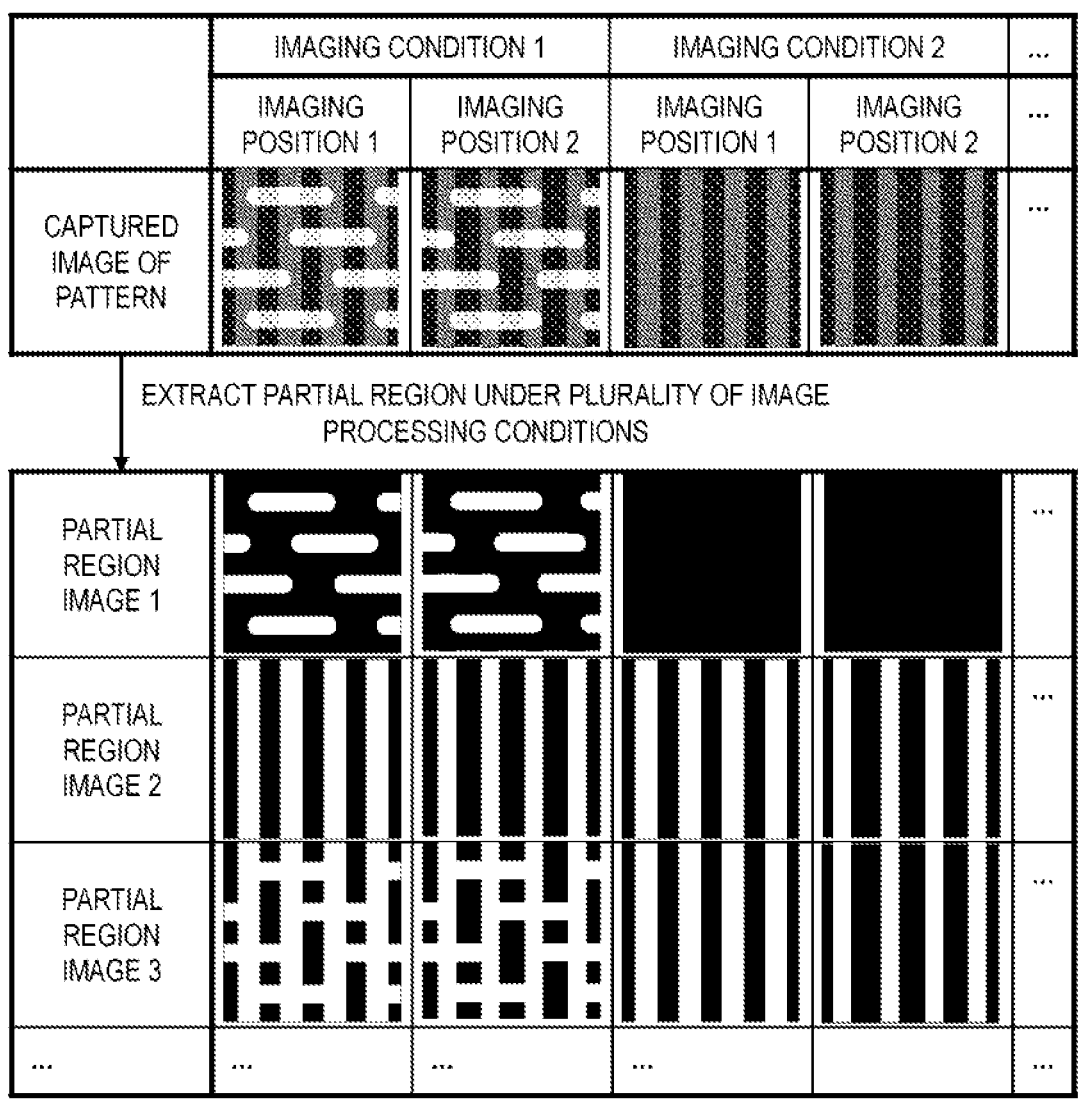
FIG. 8 is a diagram showing an example in which a partial region is extracted from patterns of FIGS. 4A and 4B under one or more image processing conditions.
Figure 9:
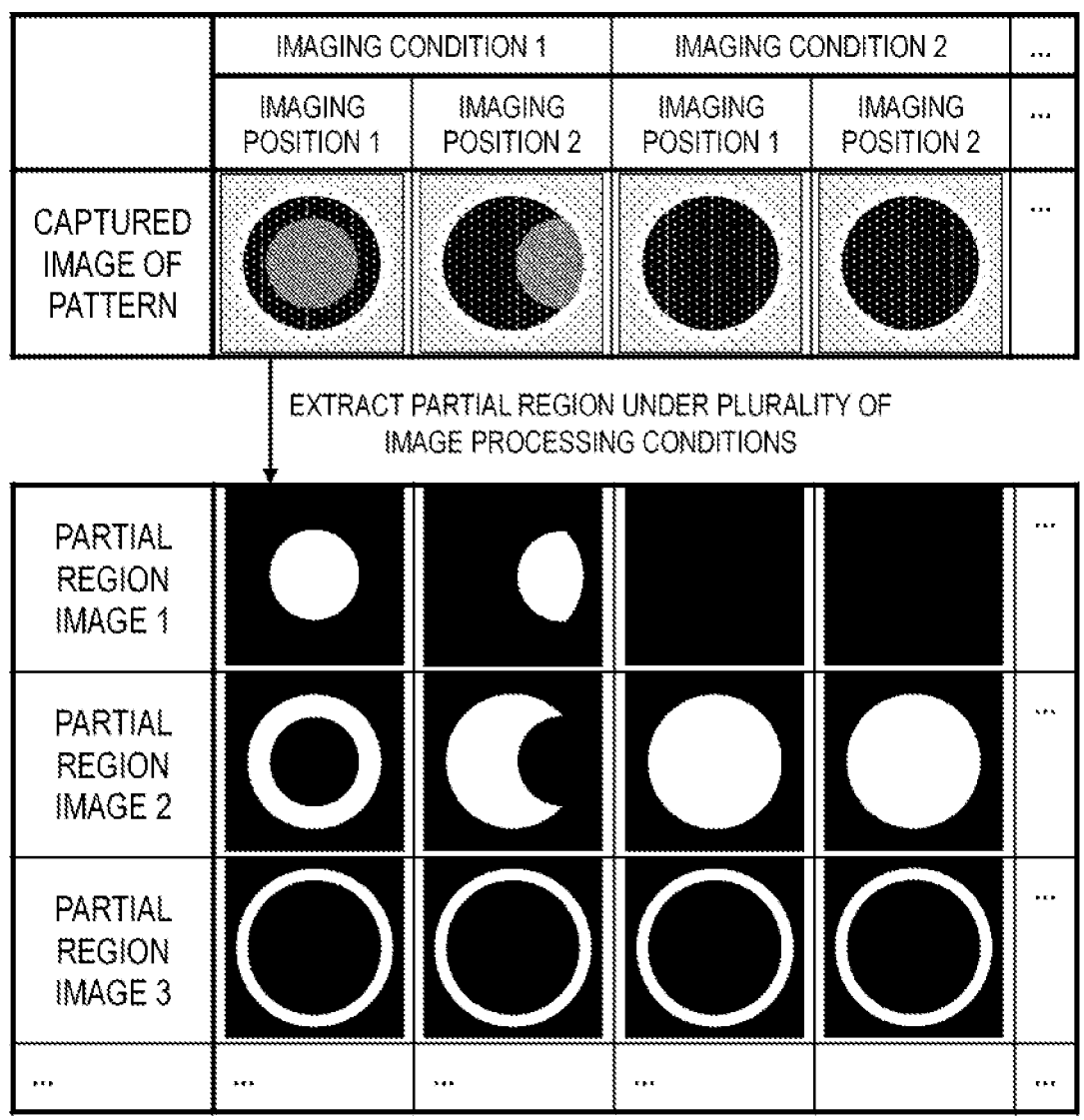
FIG. 9 is a diagram showing an example in which a partial region is extracted from patterns of FIGS. 5A and 5B under one or more image processing conditions.

FIG. 8 shows an example in which a partial region is extracted from the patterns of FIGS. 4A and 4B under one or more image processing conditions. FIG. 9 shows an example in which a partial region is extracted from the patterns of FIGS. 5A and 5B under one or more image processing conditions.

An imaging condition 1 is an appropriate imaging condition, and an imaging condition 2 is an inappropriate imaging condition. An imaging position 1 corresponds to a position where the pattern is correctly formed, and an imaging position 2 corresponds to a position where the pattern is not correctly formed. The partial region images show states in which patterns of different layers are extracted. In the present embodiment, an appropriate combination condition is derived from combination conditions of the imaging condition and the image processing condition by processing to be described later.

As described above, a captured image may be obtained by one time imaging operation using a plurality of detectors. In FIGS. 8 and 9, each partial region is represented by a binary image of white and black, and may be represented by an image having three or more colors according to the image processing algorithm.

The calculation unit 202 acquires a regression curve of the region feature and the teaching information based on the plurality of captured images under each of condition sets each including a combination of the imaging condition and the feature determination condition (step 111).

For example, when the candidate list of the imaging condition includes imaging conditions A1 and A2, the feature determination condition includes a single image processing condition, and the candidate list of the image processing condition includes image processing conditions B1 and B2, there are four condition sets as follows, and a total of four regression curves are acquired.

Condition set X1: Imaging condition A1 & Image processing condition B1

Condition set X2: Imaging condition A1 & Image processing condition B2

Condition set X3: Imaging condition A2 & Image processing condition B1

Condition set X4: Imaging condition A2 & Image processing condition B2

For example, when the candidate list of the imaging condition includes the imaging conditions A1 and A2, the feature determination condition includes two image processing conditions, and the candidate list of the image processing condition includes image processing conditions B1, B2, and B3, there are three feature determination conditions as follows.

Feature determination condition C1: Image processing conditions B1+B2

Feature determination condition C2: Image processing conditions B1+B3

Feature determination condition C3: Image processing conditions B2+B3

There are six condition sets as follows, and a total of six regression curves are acquired.

Condition set Y1: Imaging condition A1 & Feature determination condition C1

Condition set Y2: Imaging condition A1 & Feature determination condition C2

Condition set Y3: Imaging condition A1 & Feature determination condition C3

Condition set Y4: Imaging condition A2 & Feature determination condition C1

Condition set Y5: Imaging condition A2 & Feature determination condition C2

Condition set Y6: Imaging condition A2 & Feature determination condition C3

Here, there are a plurality of condition sets. That is, at least one of the imaging condition and the feature determination condition is plural.

FIG. 10 shows an example of a regression curve in a case in which the overlay error is used as the teaching information and a center deviation amount between different partial regions is used as the region feature. In one example, a simple straight line is used as the regression curve. For example, when the region feature is X and the overlay error as the teaching information is Y, a straight line of Y=aX+b (where a and b are constants) is used. The regression curve shown in FIG. 10 represents a reference example, and does not necessarily match the first embodiment.

By using the regression curve as the straight line, an amount of calculation can be reduced.

In addition, it is preferable that the regression curve is represented by using dimensions (height, diameter, overlay error, and the like) related to a semiconductor pattern as parameters. In this manner, the semiconductor pattern can be appropriately evaluated.

Figure 12:
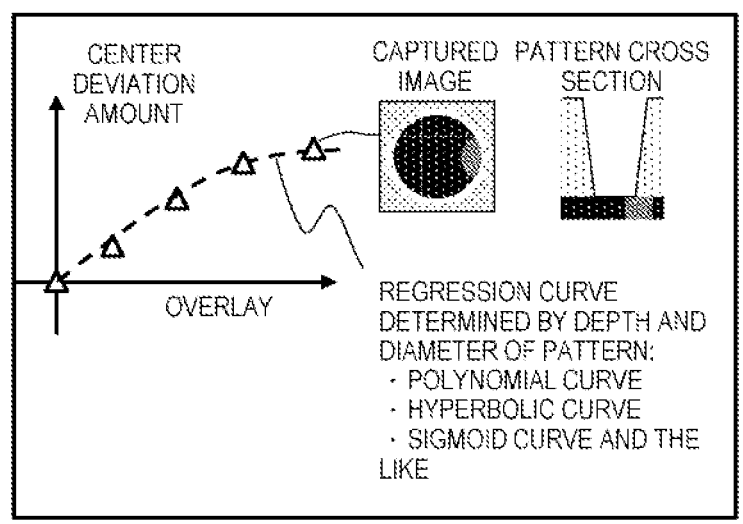
FIG. 12 is a diagram showing an example of a regression curve that is modeled in consideration of a degree of hiding based on a dimension, such as a depth of the pattern, in the example in which the lower layer pattern is partially hidden and cannot be seen as in FIG. 5B.

As the regression curve, a curve may be used instead of a straight line. In particular, as shown in FIG. 12, in a case in which a lower layer pattern appearing at a hole bottom is gradually hidden by an upper layer pattern as an overlay error increases, the lower layer pattern is extracted only within the hole bottom, and thus an upper limit of a center deviation amount becomes a radius of the hole bottom. In such a case, instead of a straight line, it may be better to use a function modeled by using dimensions such as a diameter and a depth of a hole. For example, the regression curve may be a polynomial curve, a hyperbolic curve, or a sigmoid curve. That is, when Y=f (X) is satisfied, a function representing these curves may be used for f (X).

By using such a regression curve, more flexible evaluation of the condition set can be performed. In addition, for example, even in a case in which the region feature and the teaching information do not simply coincide with each other, or in a case in which a dimension of the region feature and a dimension of the teaching information are different from each other, it is possible to appropriately evaluate the condition set.

After step 111, the calculation unit 202 selects a regression curve having a minimum regression error from these regression curves, and acquires a condition set corresponding to the selected regression curve (step 112). That is, the calculation unit 202 selects one condition set based on the regression curve. A case in which a plurality of condition sets (for example, upper predetermined ranges) may be selected is as a modification.

Finally, the storage unit 206 stores the selected condition set (that is, the combination of the imaging condition and the feature determination condition, and the feature determination condition includes one or more image processing conditions as described above) in association with the wafer ID.

The processing of FIG. 1 can be executed for all wafer IDs. Thereafter, when an overlay measurement error is measured from a certain wafer, the operation unit 204 acquires a wafer ID of the certain wafer, and the calculation unit 202 reads a condition set selected for the wafer ID from the storage unit 206, and can perform imaging and image processing using the condition set. When this condition set is used, it is possible to appropriately measure the pattern dimension and the overlay error.

In the present embodiment, the experimental wafer having the known overlay error, as the teaching information described in step 102, is used. The experimental wafer is prepared by, for example, intentionally shifting an exposure position when a pattern is transferred onto the wafer by an exposure machine. As a result, it is possible to prepare an experimental wafer having a different overlay error for each exposure range of the pattern. It is possible to create a necessary data set in step 102 by associating the imaging recipe with information indicating to which position on the experimental wafer the exposure range is shifted and to what extend the exposure range is shifted.

Second Embodiment

In a second embodiment, an inclined beam is utilized. The present embodiment is different from the first embodiment in that the teaching information includes an irradiation angle of the charged particle beam instead of or in addition to the overlay error.

An apparatus configuration in the present embodiment can be the same as the configuration of the scanning electron microscope shown in FIG. 11 described in the first embodiment.

FIGS. 13A and 14A show SEM images 1303, 1403 obtained by irradiating and scanning the patterns shown in FIGS. 4A and 5A with electron beams 1301, 1401 directly from upward, respectively. FIGS. 13B and 14B show SEM images 1304, 1404 obtained by irradiating and scanning the patterns with inclined electron beams 1302, 1402, respectively.

In examples of FIGS. 13A and 13B, by inclining the electron beam, it is possible to generate an image similar to the image having the overlay error shown in the SEM image 407 of FIG. 4B. That is, as long as the irradiation angle of the electron beam is set as the teaching information and the region feature is set as the center deviation amount between the different partial regions, the imaging condition and the image processing condition suitable for measuring an overlay error of an upper layer and a lower layer can be automatically selected.

In addition, in examples of FIGS. 14A and 14B, by inclining the electron beam, it is possible to generate an image simulating an overlay error of an opening portion in an upper surface of a hole pattern and a hole bottom. That is, as long as the irradiation angle of the electron beam is set as the teaching information and the region feature is set as the center deviation amount between the different partial regions, the imaging condition and the image processing condition suitable for measuring this overlay error can be automatically selected.

This overlay error indicates a degree of inclination of the deep hole, is an index different from deviation from the center of the lower layer pattern described in FIG. 5B, and is one of useful management indexes in a deep hole process.

According to the present embodiment, it is not necessary to prepare a special experimental sample, and it is possible to acquire the teaching information and automatically select the imaging condition and the image processing condition only by a scanning electron microscope apparatus.

Third Embodiment

In a third embodiment, an electrical characteristic value is utilized.

The present embodiment is different from the first embodiment in that the teaching information includes electrical characteristic information instead of or in addition to the overlay error. An apparatus configuration in the present embodiment can be the same as the configuration of the scanning electron microscope shown in the block diagram of FIG. 2 and FIG. 11 described in the first embodiment.

In general, after a wiring process, an electrical characteristic inspection is performed on a semiconductor device for a purpose of checking whether electrical performance is good. Therefore, the imaging condition and the image processing condition may be optimized by using the teaching information (capacitance, electrical resistance, and the like) indicating whether an electrical characteristic is good.

According to the present embodiment, it is possible to optimize the imaging condition and the image processing condition based on final performance of the semiconductor device, that is, the electrical performance.

In the first to third embodiments, the methods for automatically selecting both the imaging condition and the image processing condition simultaneously are described, but it is also possible to adopt a method for fixing one condition and only automatically selecting the other condition.

Fourth Embodiment

In the fourth embodiment, a graphical user interface (GUI) is used.

The present embodiment is different from any one of the first to third embodiments in that a specific GUI is further used. An automatic selection function box 300 for the imaging condition and the image processing condition shown in FIG. 3 displays the following components on a screen.

Wafer ID input box 304

Imaging condition candidate selection box 301 (selection box for selecting imaging condition. Steps 101 to 103)

Image processing condition candidate selection box 302 (selection box for selecting feature determination condition. Step 104)

Region feature and teaching information selection box 303 (selection box for selecting teaching information. Step 105)

According to the fourth embodiment, since the operation unit 204 outputs the GUI for acquiring the teaching information and the feature determination condition, a user can easily input necessary items.

Figure 3:
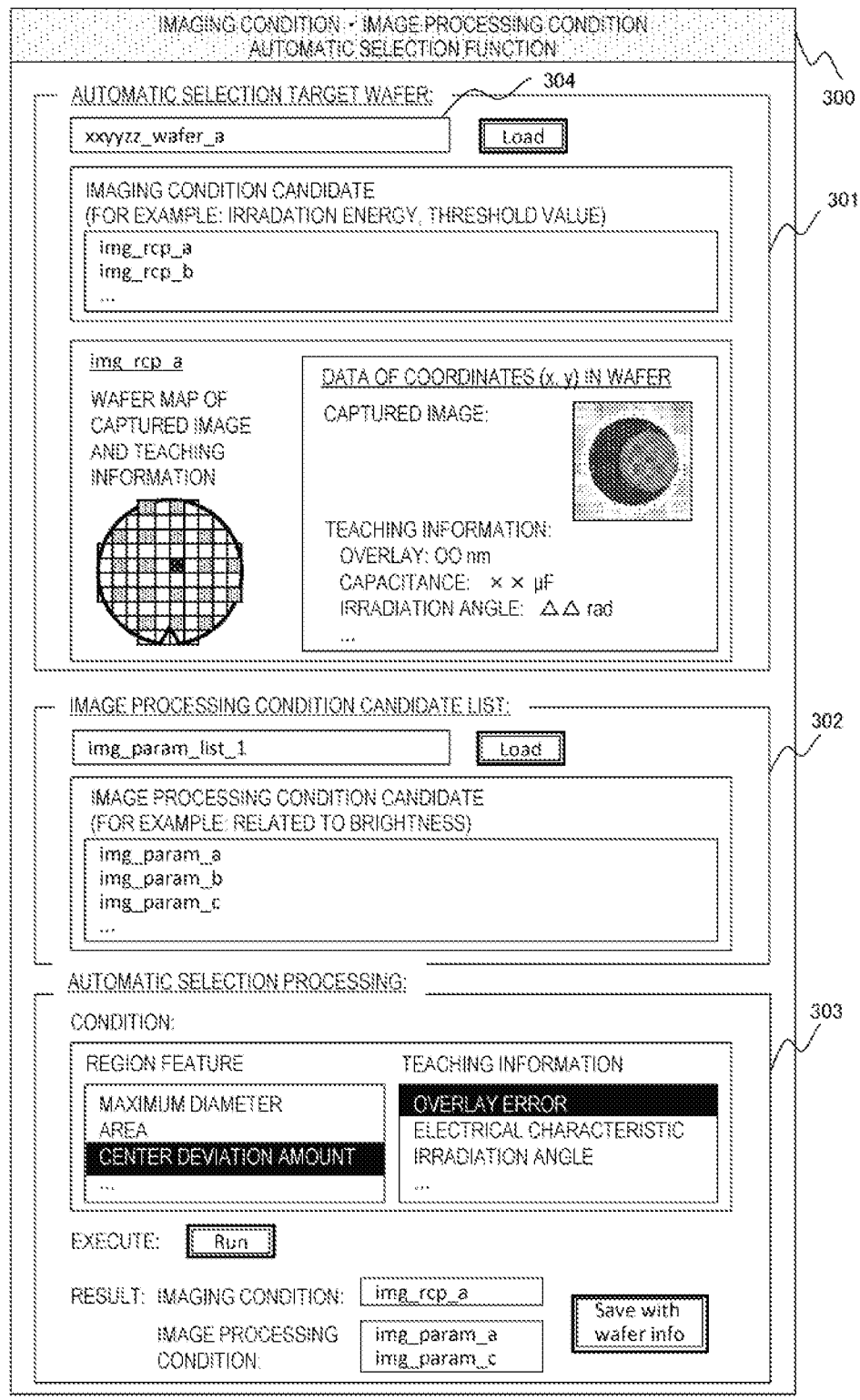
FIG. 3 is a view showing an example of a GUI screen for setting an automatic selection function of the imaging condition and the image processing condition.

As shown in FIG. 3, the GUI may display the teaching information associated with the imaging conditions. In this manner, the user can easily grasp the teaching information that can be used.

What is claimed is:

1. A non-transitory computer-readable medium storing a program for determining a condition related to a captured image of a charged particle beam apparatus, when executed by a processor causes the processor to:
   acquire a plurality of captured images:
      each of the plurality of captured images being an image generated by irradiating a pattern formed on a wafer with a charged particle beam, and detecting electrons emitted from the pattern,
      each of the plurality of captured images being an image captured according to one or more imaging conditions;
   acquire teaching information for each of the plurality of captured images;
   acquire one or more feature determination conditions; and
   calculate a feature for each of the plurality of captured images based on each of the one or more feature determination conditions,
      at least one of the one or more imaging conditions and the one or more feature determination conditions being plural;
   acquire a regression curve of the feature and the teaching information based on the plurality of captured images under each of condition sets each including a combination of the one or more imaging conditions and the one or more feature determination conditions; and
   select one or more of the condition sets based on the regression curve.

2. The non-transitory computer readable medium according to claim 1, wherein
   the one or more imaging conditions includes information related to at least one of irradiation energy of the charged particle beam, and a threshold value of energy used when emitted electrons are detected.

3. The non-transitory computer-readable medium according to claim 1, wherein
   the one or more feature determination conditions include a combination of a plurality of image processing conditions, and
   the processor calculates the feature for each of the plurality of captured images by extracting a partial region based on each of the plurality of image processing conditions.

4. The non-transitory computer-readable medium according to claim 3, wherein
the feature at least includes one of an area of the partial region, a circumferential length of the partial region, a maximum diameter of the partial region, and a minimum diameter of the partial region.

5. The non-transitory computer readable medium according to claim 3, wherein
the plurality of image processing condition includes a first image processing condition and a second image processing condition,
the processor extracts a first partial region for each of the plurality of captured images based on the first image processing condition,
the processor extracts a second partial region for each of the plurality of captured images based on the second image processing condition, and
the feature at least includes one of a deviation amount between a center position of the first partial region and a center position of the second partial region, an area of a portion in which the first partial region and the second partial region overlap, a circumferential length of a portion in which the first partial region and the second partial region overlap, a maximum diameter of a portion in which the first partial region and the second partial region overlap, and a minimum diameter of a portion in which the first partial region and the second partial region overlap.

6. The non-transitory computer-readable medium according to claim 1, wherein
the teaching information includes an overlay error of a semiconductor pattern.

7. The non-transitory computer-readable medium according to claim 1, wherein
the teaching information includes an irradiation angle of a charged particle beam.

8. The non-transitory computer-readable medium according to claim 1, wherein
the teaching information includes electrical characteristic information.

9. The non-transitory computer-readable medium according to claim 1, wherein
the one or more feature determination conditions include information related to brightness.

10. The non-transitory computer-readable medium according to claim 1, wherein
the regression curve is a straight line.

11. The non transitory computer-readable medium according to claim 1, wherein
the regression curve is represented by using a dimension related to a semiconductor pattern as a parameter.

12. The non transitory computer-readable medium according to claim 1, wherein
the regression curve is a polynomial curve, a hyperbolic curve, or a sigmoid curve.

13. The non-transitory computer readable medium according to claim 1, wherein
the plurality of captured images include an image captured at each of a plurality of positions.

14. The non-transitory computer-readable medium according to claim 1, further comprising:
outputting, by the processor, a graphical user interface configured to acquire the teaching information and the one or more feature determination conditions.

15. The non-transitory computer-readable medium according to claim 14, wherein
the graphical user interface displays a selection box for selecting the one or more imaging conditions, a selection box for selecting the one or more feature determination conditions, and a selection box for selecting the teaching information.

16. The non-transitory computer-readable medium according to claim 14, wherein
the graphical user interface displays the teaching information associated with the one or more imaging conditions.

17. The non-transitory computer-readable medium according to claim 1, further comprising:
acquiring, by the processor, the one or more imaging conditions, wherein
each of the plurality of captured images is acquired in association with the respective one or more imaging conditions.

18. The non-transitory computer-readable medium according to claim 1, further comprising:
acquiring, by the processor, a wafer ID for identifying the wafer, wherein
the plurality of captured images are respectively acquired in association with the wafer IDs.

19. A computer comprising:
a processor; and
a storage medium that stores a program, wherein
the processor acquires a plurality of captured images by executing the program,
each of the plurality of captured images is an image generated by irradiating a pattern formed on a wafer with a charged particle beam, and detecting electrons emitted from the pattern,
each of the plurality of captured images is an image captured according to one or more imaging conditions,
by executing the program, the processor further
acquires teaching information for each of the plurality of captured images,
acquires one or more feature determination conditions, and
calculates a feature for each of the plurality of captured images based on each of the one or more feature determination conditions,
at least one of the one or more imaging conditions and the feature determination condition being plural,
by executing the program, the processor still further
acquires a regression curve of the feature and the teaching information based on the plurality of captured images under each of condition sets each including a combination of the one or more imaging conditions and the one or more feature determination conditions, and
selects one or more of the condition sets based on the regression curve.

20. The computer according to claim 19, wherein
the one or more imaging conditions includes information related to at least one of irradiation energy of the charged particle beam, and a threshold value of energy used when emitted electrons are detected.

21. The computer according to claim 19, wherein
the one or more feature determination conditions include a combination of a plurality of image processing conditions, and
the processor calculates the feature for each of the plurality of captured images by extracting a partial region based on each of the plurality of image processing conditions.

22. The computer according to claim 21, wherein
the feature at least includes one of an area of the partial region, a circumferential length of the partial region, a maximum diameter of the partial region, and a minimum diameter of the partial region.

23. The computer according to claim 21, wherein
the plurality of image processing condition includes a first image processing condition and a second image processing condition,
the processor extracts a first partial region for each of the plurality of captured images based on the first image processing condition,
the processor extracts a second partial region for each of the plurality of captured images based on the second image processing condition, and
the feature at least includes one of a deviation amount between a center position of the first partial region and a center position of the second partial region, an area of a portion in which the first partial region and the second partial region overlap, a circumferential length of a portion in which the first partial region and the second partial region overlap, a maximum diameter of a portion in which the first partial region and the second partial region overlap, and a minimum diameter of a portion in which the first partial region and the second partial region overlap.

24. The computer according to claim 19, wherein
the teaching information includes an overlay error of a semiconductor pattern.

25. The computer according to claim 19, wherein
the teaching information includes an irradiation angle of a charged particle beam.

26. The computer according to claim 19, wherein
the one or more feature determination conditions include information related to brightness.

27. The computer according to claim 19, wherein
the regression curve is a straight line.

28. The computer according to claim 19, wherein
the regression curve is represented by using a dimension related to a semiconductor pattern as a parameter.

* * * * *